(12) United States Patent
Hwang et al.

(10) Patent No.: US 6,329,266 B1
(45) Date of Patent: Dec. 11, 2001

(54) METHODS OF FORMING ISOLATION TRENCHES INCLUDING DAMAGING A TRENCH ISOLATION MASK

(75) Inventors: Ki-Hyun Hwang, Kyunggi-do; Seok-Woo Nam, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/323,500

(22) Filed: Jun. 1, 1999

(30) Foreign Application Priority Data

Jun. 16, 1998 (KR) ..................... 98-22584

(51) Int. Cl.⁷ .................................. H01L 21/76
(52) U.S. Cl. ............................ 438/424; 438/425
(58) Field of Search ........................ 438/424, 425, 438/426, 436, 437; 257/510, 513, 639

(56) References Cited

U.S. PATENT DOCUMENTS

| | | | |
|---|---|---|---|
| 4,636,281 | 1/1987 | Buiguez et al. | 156/643 |
| 5,360,753 | 11/1994 | Park et al. | 437/67 |
| 5,372,950 | 12/1994 | Kim et al. | 437/24 |
| 5,447,884 | 9/1995 | Fahey et al. | 437/67 |
| 5,665,635 | 9/1997 | Kwon et al. | 438/427 |
| 5,679,599 | 10/1997 | Mehta | 437/69 |
| 5,712,205 | 1/1998 | Park et al. | 438/425 |
| 5,726,090 | 3/1998 | Jang et al. | 438/435 |
| 5,728,620 | 3/1998 | Park | 438/425 |
| 5,741,740 | 4/1998 | Jang et al. | 438/435 |
| 5,786,262 | 7/1998 | Jang et al. | 438/424 |
| 5,804,491 | 9/1998 | Ahn | 438/425 |
| 5,811,345 | 9/1998 | Yu et al. | 438/424 |
| 5,817,566 | 10/1998 | Jang et al. | 438/424 |
| 5,837,612 | 11/1998 | Ajuria et al. | 438/697 |
| 6,037,238 | * 3/2000 | Chang et al. | 438/426 |
| 6,046,487 | * 4/2000 | Benedict et al. | 257/510 |
| 6,080,637 | * 6/2000 | Huang et al. | 426/424 |

* cited by examiner

*Primary Examiner*—David Nelms
*Assistant Examiner*—Dung A Le
(74) *Attorney, Agent, or Firm*—Myers Bigel Sibley & Sajovec

(57) ABSTRACT

A method of forming an isolation trench for an integrated circuit device includes forming a trench mask layer on a surface of a semiconductor substrate wherein a portion of the semiconductor substrate is exposed through the trench mask layer. An isolation trench is formed in the exposed portion of the semiconductor substrate, and a nitride liner is formed on surfaces of the isolation trench. A trench isolation layer is formed on the nitride liner wherein the trench isolation layer fills the trench, and the trench mask layer is damaged. The damaged trench mask layer is stripped so that the surface of the semiconductor substrate is exposed.

22 Claims, 3 Drawing Sheets

METHODS OF FORMING ISOLATION TRENCHES INCLUDING DAMAGING A TRENCH ISOLATION MASK

FIELD OF THE INVENTION

The present invention relates to the field of integrated circuits and more particularly to methods of forming isolation trenches for integrated circuit devices.

BACKGROUND OF THE INVENTION

As Dynamic Random Access Memory (DRAM) devices have become more highly integrated, device isolation methods have changed from the conventional LOCOS (local oxidation of silicon) technique to the STI (shallow trench isolation) technique. In case of the STI techniques, however, expansion of the oxide layer in the trench inner walls may cause a shallow pit in an active region. As a result, leakage currents may increase in the active region of a semiconductor substrate.

To reduce the above-mentioned problem, a nitride liner has been used as an oxidation masking layer to reduce subsequent oxidation of the trench inner wall. With the use of the nitride liner, the shallow pit can be reduced. The nitride liner, however, may be etched to a point below a surface of the semiconductor substrate (i.e., the nitride liner may be dented) during etching of an active nitride masking layer when using phosphoric acid. Thus, the dented nitride liner may cause a stringer residue in the subsequent step of etching a gate poly.

To reduce the described problems, a shallow isolation trench with a nitride liner having a thickness of less than 50 Å has been proposed. See, for example, U.S. Pat. No. 5,447,884, the disclosure of which is hereby incorporated herein in its entirety by reference.

The method mentioned above includes the steps of: depositing a protective (masking) layer containing at least one layer of nitride on the semiconductor substrate; etching through the protective layer to form a set of isolation mask apertures; etching through the set of isolation mask apertures to form a set of isolation trenches; depositing a conformal liner of nitride having a thickness less than 50 Å; depositing a CVD layer of oxide having a thickness sufficient to fill the set of isolation trenches; removing the portion of the CVD layer of oxide outside the set of isolation trenches to expose the at least one layer of nitride; and stripping the at least one layer of nitride in phosphoric acid. According to above method, the denting of the conformal nitride liner may be reduced by using a very thin nitride liner as an oxidation masking layer. The conformal nitride liner, however, may be so thin that it is insufficient to prevent oxidation of the trench inner wall.

Therefore, a method is needed which not only reduces denting the nitride liner but also reduces oxidation of the interior walls of the trench.

SUMMARY OF THE INVENTION

It is, therefore, an object of the present invention to provide improved methods of forming isolation trenches.

This and other objects are provided according to the present invention by forming a trench mask layer on a surface of a semiconductor substrate wherein a portion of the semiconductor substrate is exposed through the trench mask layer, and forming an isolation trench in the exposed portion of the semiconductor substrate. A nitride liner is formed on surfaces of the isolation trench, a trench isolation layer is formed on the nitride liner wherein the trench isolation layer fills the trench, and the trench mask layer is damaged. The damaged trench mask layer is then stripped so that the surface of the semiconductor substrate is exposed. By damaging the trench mask layer before stripping the trench mask layer, the time needed to strip the trench mask layer can be reduced, and damage to the nitride liner can be reduced. Accordingly, the isolation characteristics of the isolation trench can be improved.

In particular, the trench mask layer can include a nitride trench mask layer and the step of damaging the trench mask layer can include damaging the nitride trench mask layer thereby weakening Si—N bonds of the nitride trench mask layer. More particularly, the step of damaging the trench mask layer can include implanting ions into the trench mask layer. For example, ions selected from the group of phosphorus (P), arsenic (As), boron (B), argon (Ar), and silicon (Si) can be implanted at a dose in the range of approximately $1 \times 10^{10}$ cm$^{-2}$ to approximately $1 \times 10^{17}$ cm$^{-2}$, at an acceleration energy in the range of approximately 10 keV to approximately 1000 keV.

Alternately, the step of damaging the trench mask layer can include plasma treating the trench mask layer. For example, the plasma treatment can be performed using an element selected from the group of xenon (Xe), krypton (Kr), and argon (Ar) at a power in the range of approximately 10 W to approximately 5000 W at a pressure in the range of approximately $1 \times 10^4$ Torr to approximately 700 Torr.

In addition, the step of forming the trench mask layer can include forming a pad oxide layer on the surface of the substrate, forming a nitride layer on the pad oxide layer opposite the substrate, and patterning the pad oxide and nitride layers to provide the trench mask layer. Moreover, the step of forming the isolation trench can include etching the exposed portion of the substrate. Furthermore, the step of forming the nitride liner may be preceded by the step of forming an oxide layer on the surfaces of the isolation trench. The formation of the oxide layer can reduce crystal damage in the substrate resulting from the etching of the trench.

According to the present invention, denting of the nitride liner can be reduced by damaging the trench mask layer before stripping the trench mask layer. Accordingly, isolation characteristics of the isolation trench can be improved. In addition, the time needed to strip the trench mask layer can be reduced.

DETAILED DESCRIPTION

Figure 1:
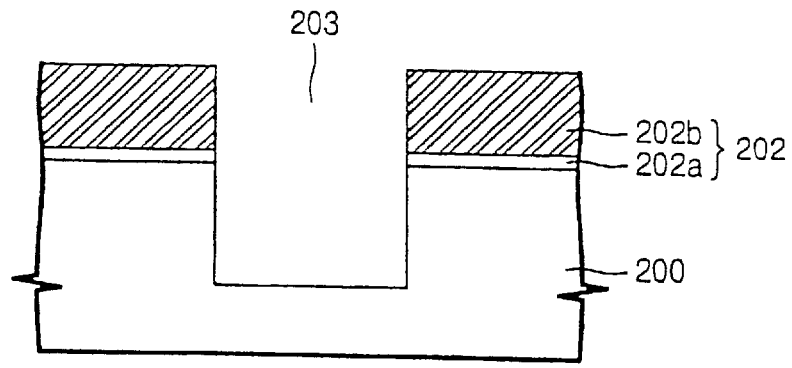
FIGS. 1–7 are cross sectional views illustrating steps of a method of forming isolation trenches according to the present invention.

The present invention will now be described more fully herein after with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

FIGS. 1–7 are cross-sectional views illustrating steps of a method of forming an isolation trench according to the present invention. As shown in FIG. 1, a pad oxide layer 202a and an active nitride layer 202b are sequentially formed on a semiconductor substrate 200 to provide a trench mask layer 202. The trench mask layer 202 is patterned using known photolithographic techniques to expose portions of the semiconductor substrate 200. Thereafter, the semiconductor substrate 200 is etched using the trench mask layer 202 as an etch mask to form a trench 203.

Figure 2:
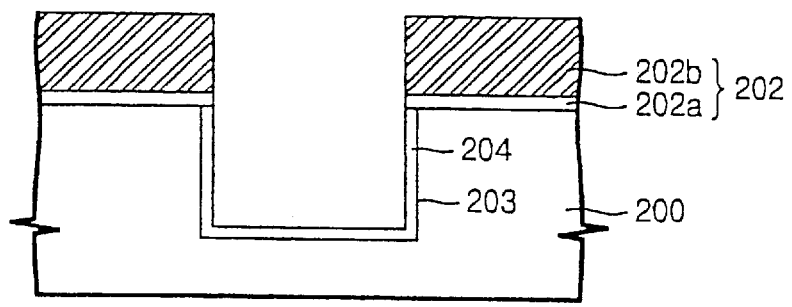

Referring to FIG. 2, an oxide layer 204 is formed on the bottom surface and both sidewalls of the trench 203 to reduce defects in silicon lattices caused by etching the semiconductor substrate 200. The oxide layer 204 can be, for example, a silicon dioxide ($SiO_2$) layer.

Figure 3:
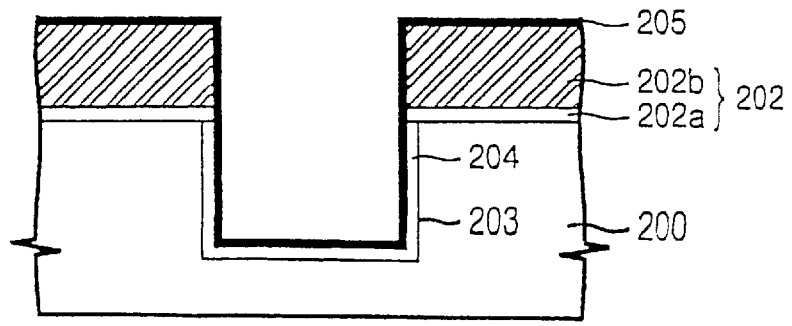

Referring to FIG. 3, an oxidation masking layer such as a nitride liner 205 is formed on the active nitride layer 202b of the trench mask layer 202 and on the oxide layer 204 in the trench 203 using an LPCVD technique to reduce subsequent oxidation of the trench inner wall. The nitride liner 205 can be, for example, a silicon nitride ($Si_3N_4$) layer. The nitride liner 205 can be formed to have a thickness in the range of approximately 300 Å to approximately 600 Å sufficient to reduce subsequent oxidation.

Figure 4:
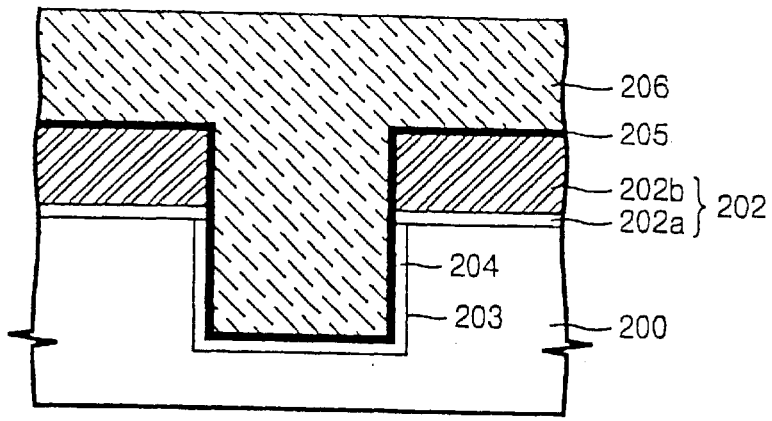
Figure 5:
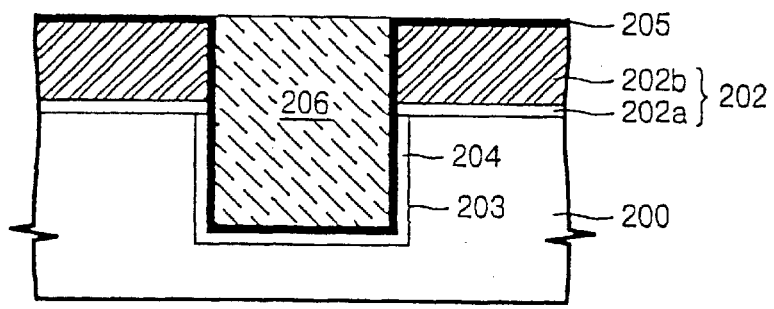

Referring to FIG. 4, a trench isolation layer 206 (for example, a USG ($O_3$ TEOS) layer) is deposited to fill the trench 203. Thereafter, an annealing step is performed to densify the trench isolation layer 206. Referring to FIG. 5, the trench isolation layer 206 is removed until upper surfaces of the nitride liner 205 are exposed by using planarization-etching, for example, a CMP process.

Figure 6:
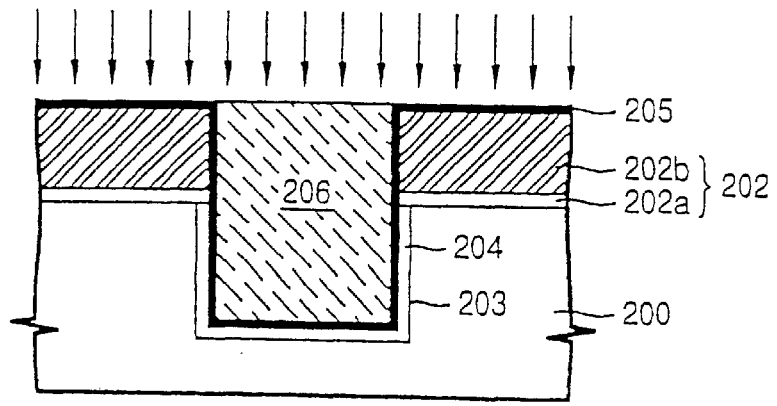

Referring to FIG. 6, an ion implantation or plasma treatment is performed to weaken the Si—N bonding force of the active nitride layer 202b without significantly damaging the semiconductor substrate 200. Due to this ion implantation or plasma treatment, the time needed to strip the active nitride layer 202b can be reduced. The above-mentioned ion implantation can be carried out by implanting ions selected from the group consisting of P, As, B, Ar, and Si with a dose in the range of approximately $1 \times 10^{10}$ $cm^{-2}$ to approximately $1 \times 10^{17}$ $cm^{-2}$, and with an acceleration energy in the range of approximately 10 keV to approximately 1000 keV. On the other hand, the above-mentioned plasma treatment can be carried out using ions selected from the group consisting of Xe, Kr, and Ar with a power in the range of approximately 10 W to approximately 5000 W, and a pressure in the range of approximately $1 \times 10^{-4}$ Torr to approximately 700 Torr.

Figure 7:
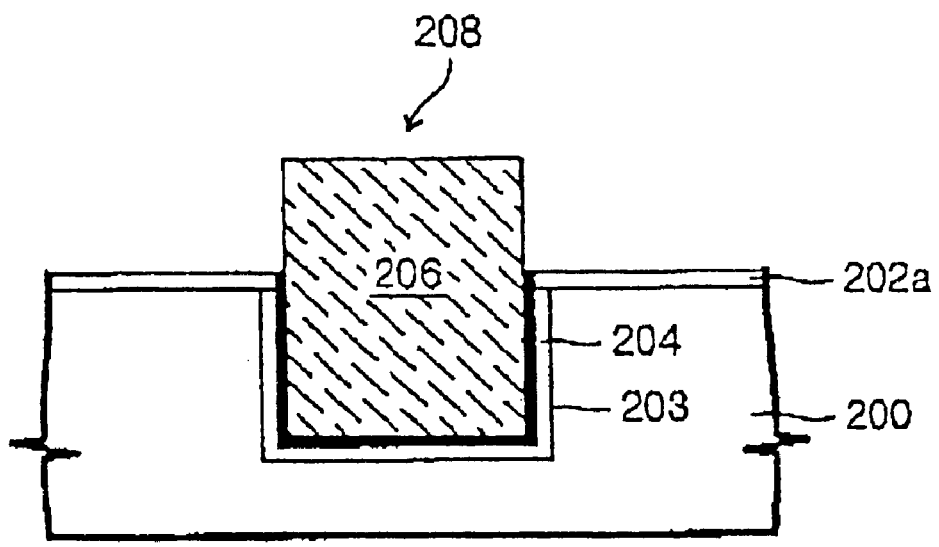

As shown in FIG. 7, the trench isolation 208 is formed by etching the trench mask layer 202b using phosphoric acid until the pad oxide layer 200a is exposed.

According to the present invention, the active nitride layer of the trench mask layer is damaged before stripping the trench mask layer. In particular, the active nitride layer can be damaged using an ion implantation or a plasma treatment. The stripping time of the active nitride layer (and thus the trench mask layer) can thereby be reduced. More particularly, the ion implantation of the plasma treatment can weaken the Si—N bond force in the active nitride layer. Accordingly, denting of the nitride liner in the trench can be reduced, and the isolation characteristics of the trench can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an isolation trench for an integrated circuit device, the method comprising the steps of:
    forming a trench mask layer on a surface of a semiconductor substrate wherein a portion of the semiconductor substrate is exposed through the trench mask layer;
    forming an isolation trench in the exposed portion of the semiconductor substrate;
    forming a nitride liner on surfaces of the isolation trench;
    forming a trench isolation layer on the nitride liner wherein the trench isolation layer fills the trench;
    damaging the trench mask layer; and
    stripping the damaged trench mask layer so that the surface of the semiconductor substrate is exposed.

2. A method according to claim 1 wherein the trench mask layer comprises a nitride trench mask layer and wherein the step of damaging the trench mask layer comprises damaging the nitride trench mask layer.

3. A method according to claim 2 wherein the step of damaging the trench mask layer comprises weakening Si—N bonds of the nitride trench mask layer.

4. A method according to claim 1 wherein the step of damaging the trench mask layer comprises implanting ions into the trench mask layer.

5. A method according to claim 4 wherein the ions are selected from the group consisting of P, As, B, Ar, and Si.

6. A method according to claim 4 wherein the ions are implanted at a dose in the range of approximately $1 \times 10^{10}$ $cm^{-2}$ to approximately $1 \times 10^{17}$ $cm^{-2}$.

7. A method according to claim 4 wherein the ions are implanted at an acceleration energy in the range of approximately 10 keV to approximately 1000 keV.

8. A method according to claim 1 wherein the step of damaging the trench mask layer comprises plasma processing the trench mask layer.

9. A method according to claim 8 wherein the plasma processing is performed using an element selected from the group consisting of Xe, Kr, and Ar.

10. A method according to claim 8 wherein the plasma processing is performed at a power in the range of approximately 10 W to approximately 5000 W.

11. A method according to claim 8 wherein the plasma processing is performed at a pressure in the range of approximately $1 \times 10^{-4}$ Torr to approximately 700 Torr.

12. A method according to claim 1 wherein forming the nitride liner on surfaces of the isolation trench further comprises forming the nitride liner on the trench mask layer, and wherein damaging the trench mask layer comprises damaging the trench mask layer while maintaining the nitride liner on the trench mask layer.

13. A method according to claim 1 wherein damaging the trench mask layer comprises maintaining the trench mask layer while damaging the trench mask layer, and wherein stripping the trench mask layer follows damaging the trench mask layer.

14. A method according to claim 1 wherein the step of forming the trench mask layer comprises,
    forming a pad oxide layer on the surface of the substrate;
    forming a nitride layer on the pad oxide layer opposite the substrate; and
    patterning the pad oxide and nitride layers to provide the trench mask layer.

15. A method according to claim 1 wherein the step of forming the isolation trench comprises etching the exposed portion of the substrate.

16. A method according to claim 1 wherein the step of forming the nitride liner is preceded by the step of:

forming an oxide layer on the surfaces of the isolation trench.

17. A method according to claim 1 wherein the step of forming the trench isolation layer comprises, forming an isolation material in the trench and on the trench mask layer; and removing portions of the isolation material on the trench mask layer.

18. A method according to claim 1 wherein the step of stripping the trench mask layer is preceded by the step of:

annealing the trench isolation layer.

19. A method of forming an isolation trench for a semiconductor device, the method comprising the steps of:

forming a pad oxide layer on a semiconductor substrate;

forming an active nitride layer on the pad oxide layer opposite the semiconductor substrate;

patterning the pad oxide and active nitride layer to provide a trench mask layer exposing a portion of the semiconductor substrate;

etching the exposed portion of the semiconductor substrate to form a trench in the semiconductor substrate using the trench mask as an etch mask;

forming an oxide layer on a bottom surface and sidewalls of the trench;

forming a nitride liner on the oxide layer opposite the bottom surface and sidewalls of the trench and on the active nitride layer opposite the substrate;

forming a trench isolation layer on the nitride liner filling the trench;

planarization etching the trench isolation layer to remove portions of the trench isolation layer from a surface of the active nitride layer opposite the substrate;

damaging the active nitride layer to weaken Si—N bonding forces; and after damaging the active nitride layer, stripping the trench mask layer until the surface of the semiconductor substrate is exposed.

20. A method according to claim 19 wherein damaging the active nitride layer comprises damaging the active nitride layer while maintaining the nitride liner on the active nitride layer.

21. A method according to claim 19 wherein damaging the active nitride layer to weaken Si—N bonding forces comprises maintaining the active nitride layer while damaging the active nitride layer and wherein stripping the active nitride layer follows damaging the active nitride layer.

22. A method of forming an isolation trench for an integrated circuit device, the method comprising the steps of:

forming a trench mask layer on a surface of a semiconductor substrate wherein a portion of the semiconductor substrate is exposed through the trench mask layer;

forming an isolation trench in the exposed portion of the semiconductor substrate;

forming a trench isolation layer in the trench wherein the trench isolation layer fills the trench;

damaging the trench mask layer; and stripping the damaged trench mask layer so that the surface of the semiconductor substrate is exposed.

* * * * *